United States Patent
Okazawa

(10) Patent No.: US 7,009,876 B2
(45) Date of Patent: Mar. 7, 2006

(54) MRAM AND DATA WRITING METHOD THEREFOR

(75) Inventor: Takeshi Okazawa, Kanagawa (JP)

(73) Assignee: NEC Electronics Corporation, Kawasaki (JP)

( * ) Notice: Subject to any disclaimer, the term of this patent is extended or adjusted under 35 U.S.C. 154(b) by 56 days.

(21) Appl. No.: 10/690,287

(22) Filed: Oct. 21, 2003

(65) Prior Publication Data
US 2004/0081004 A1   Apr. 29, 2004

(30) Foreign Application Priority Data
Oct. 23, 2002   (JP) ............... 2002-308549

(51) Int. Cl.
G11C 11/14   (2006.01)
(52) U.S. Cl. ................... 365/171; 365/173
(58) Field of Classification Search ........... 365/171, 365/173, 158
See application file for complete search history.

(56) References Cited

U.S. PATENT DOCUMENTS 6,335,890 B1   1/2002   Reohr et al.
6,532,163 B1 *  3/2003   Okazawa ............... 365/97
6,870,759 B1 *  3/2005   Tsang ................. 365/158
6,891,742 B1 *  5/2005   Takano et al. .......... 365/145
2002/0034117 A1  3/2002   Okazawa
2002/0176272 A1  11/2002   DeBrosse et al.

FOREIGN PATENT DOCUMENTS
JP   2002-170379   6/2002

OTHER PUBLICATIONS
Partial European Search Report dated Jul. 2, 2004.

* cited by examiner

Primary Examiner—Anh Phung
(74) Attorney, Agent, or Firm—Katten Muchin Rosenman LLP

(57) ABSTRACT

In an MRAM having main and sub-structures, selecting transistors are arranged so as to meet the arrangement order of main word lines, sub-word lines and the selecting transistors. The selecting transistor is driven to cause a snap back phenomenon to occur. As a result, data can be written to a memory cell using a substrate current, not a channel current. Moreover, a data may be written into a selected memory cell by discharge the charge which is charged in the main and sub word lines corresponding to the memory cell.

10 Claims, 9 Drawing Sheets

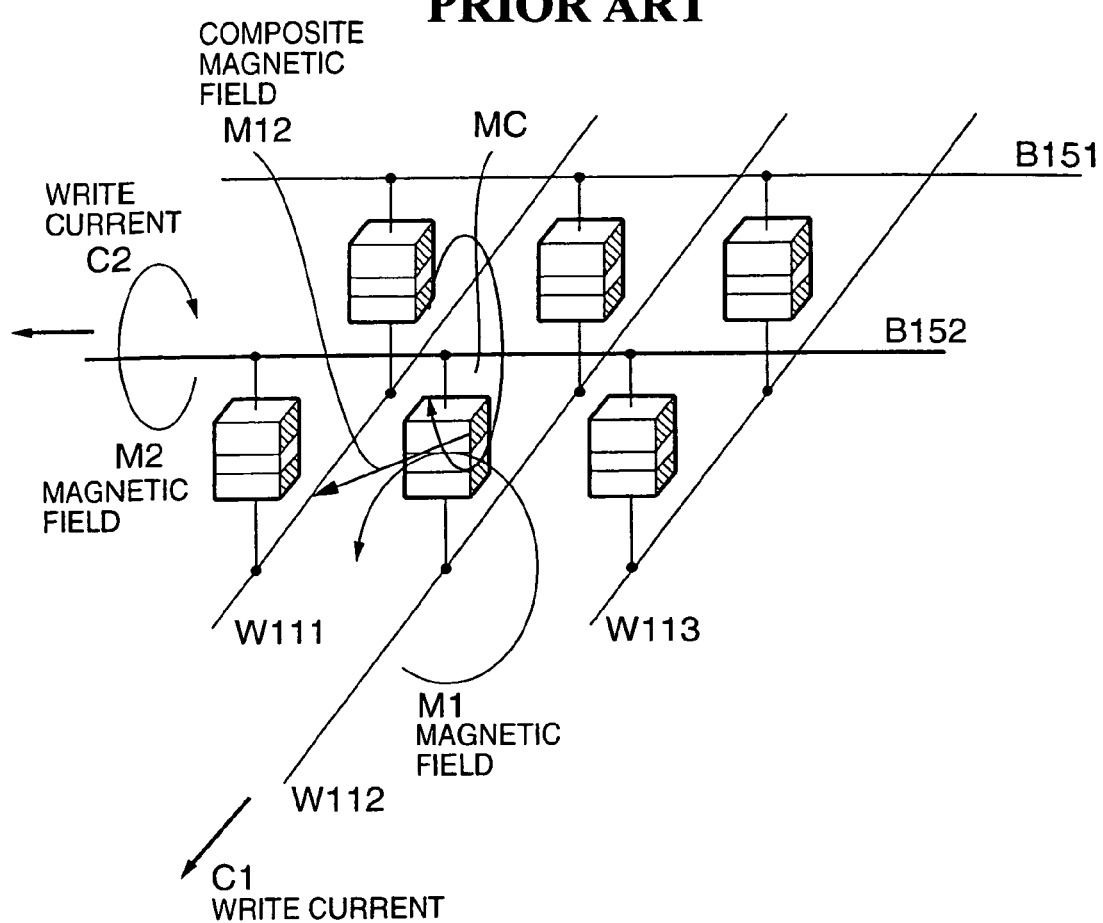

MRAM AND DATA WRITING METHOD THEREFOR

BACKGROUND OF THE INVENTION

1. Field of the Invention

The present invention relates to a magnetic random access memory (MRAM) and a data writing method therefor.

2. Related Background Art

In recent years, an MRAM which has highly densely integrated magnetic substances on a substrate as memory cells, and which has nonvolatile characteristics, a high speed operation and repetition resistance of magnetic recording, has been expected as a next generation memory.

FIGS. 7A and 7B are perspective views each useful in explaining a basic structure and an operation of a memory cell of an MRAM.

As shown in FIG. 7A, an MRAM cell includes a pinned layer 12 made of a ferromagnetic film and having a fixed magnetization direction, an insulating film 13 and a data storage layer 14 made of a ferromagnetic film. The MRAM cell is provided between a lower wiring 11 and an upper wiring 15.

FIG. 7B is a perspective view useful in explaining the operation for writing and reading out data to and from the memory cell shown in FIG. 7A.

The storage of data is carried out by utilizing the "magneto-resistance effect" in which a resistance value of the insulating film is changed by 30 to 40% between a state in which directions of magnetization of the pinned layer 12 and the data storage layer 14 are "parallel" to each other (corresponding to data 0) and a state in which directions of magnetization of the pinned layer 12 and the data storage layer 14 are "anti-parallel" to each other (corresponding to data 1). For this storage, a direction of magnetization of the data storage layer 14 is changed by an external magnetic field generated by causing a predetermined current through the upper wiring 15 and the lower wiring 11 to thereby store binary digit data, for example.

The operation for reading out data from a memory cell is as follows: A predetermined potential difference is applied across the upper wiring 15 and the lower wiring 11 to cause a tunneling current 16. This tunneling current 16 penetrates through the pinned layer 12, the insulating layer 13 and the data storage layer 14 to be caused to flow from the lower wiring 11 to the upper wiring 15. Thus, data is read out from the memory cell. That is to say, the resistance value of the insulating film 13 is changed due to the tunnel magneto-resistance effect when the directions of magnetization of the two ferromagnetic layers 12 and 14 sandwiching therebetween the insulating layer 13 are parallel or anti-parallel to each other. Then, this change in current is detected to thereby read out data stored in a memory cell to the outside.

FIG. 8 is a schematic view useful in explaining a write operation of the MRAM in which the memory cells shown in FIGS. 7A and 7B are arranged in an array.

Here, description will hereinbelow be given with respect to a case where data is written to a memory cell MC. Predetermined currents (write currents C1 and C2) are selectively caused to flow through a word line W112 and a bit line B152 at the time when data is intended to be written to the memory cell MC to regulate magnetic domains (domains) of the data storage layer of the memory cell MC in one direction by utilizing a composite magnetic field M12 obtained by composing magnetic fields (magnetic fields M1 and M2) induced in the circumference of the wirings. Thus, the operation for writing data to the memory cell MC is realized.

On the other hand, for storage of inverted data in the memory cell MC, a direction of a current to be caused to flow through one of the word line W112 and the bit line B152, e.g., the bit line B152 is selectively inverted with respect to the above-mentioned case of the operation for writing data to the memory cell MC. Thus, a direction of the magnetic field M2 is changed by 180 degrees to change a direction of the composite magnetic field M12 by 90 degrees, whereby the domains of the data storage layer in the memory cell MC are forcibly inverted. As a result, "parallelism" and "anti-parallelism" in the direction of the domains of the pinned layer and the data storage layer can be realized by utilizing the external magnetic field.

As described above, in the MRAM memory cell array, a current caused to flow through a memory cell at a crossing point between the selected word line and bit line is detected to judge a storage state. However, if a scale of a memory cell array itself is increased, then wiring resistances and wiring capacities of word lines and bit lines are increased accordingly. As a result a value of a detected current caused to flow when data is read out from a memory cell becomes small or a delay in response when data is read out therefrom is increased.

In particular, since a memory cell is constituted by an insulating film, which is about 2 nm thick, sandwiched between ferromagnetic films of two layers, for a main component of a wiring capacity, a capacity due to a memory cell connected to wirings is larger than that of the wirings themselves. Thus, if the number of memory cells connected to wirings is increased, then the wiring capacity is increased in proportion thereto.

In order to avoid such a problem, there have conventionally been taken measures that, for example, an upper limit is set to a wiring resistance so that a current level when reading out data from a memory cell does not become smaller than a predetermined value, a wiring length is limited in order to avoid an increase in wiring capacity to limit a scale of a memory cell array, and so forth.

However, as the MRAM capacity is increased, a scale of the memory cell array has to be increased. Thus, this problem has gradually become important.

In order to cope with such a problem, a proposal of dividing a memory cell array has been made.

FIG. 9 schematically shows such a configuration, and is a circuit diagram showing a sub-memory cell array constituted by sub-word lines SW1 to SWm and sub-bit lines SB1 to SBn.

The sub-word lines SW1 to SWm constituting the sub-memory cell array are connected to main word lines W1 to Wm through sub-word line selecting transistors WT1 to WTm, respectively. The sub-bit lines SB1 to SBn are connected to main bit lines B1 to Bn through sub-bit line selecting transistors BT1 to BTn, respectively. In such a manner, the memory cell array is configured in the form of a hierarchical structure of the main bit lines and the main word lines, and the sub-bit lines and the sub-word lines (refer to JP 2002-170379 A (FIG. 1) for example).

As described above, the MRAM has high performance such as the high speed rewriting and reading. However, on the other hand, since at the time when data is intended to be written, currents are caused to flow through corresponding ones of wirings to generate induced magnetic fields, relatively large write currents, i.e., write currents of several milliamperes are required per memory cell. If a method of dividing a conventional memory cell array into blocks is introduced in order to avoid the above-mentioned problem, there may be encountered a problem as will be described below. The division of the cell array, as described above, adopts a hierarchical structure having the main bit lines and the main word lines distributed so as to cover the whole cell array, and the sub-bit lines and the sub-word lines distributed only within each of the blocks (sub-cell arrays). Then, normal MOS transistors are required as switching elements for changing the main bit lines and the main word lines over to the sub-bit lines and the sub-word lines. Such switching elements are formed in each of the blocks obtained by the division to change the main bit lines and the main word lines over to the sub-bit lines and the sub-word lines, respectively. In the MRAM, an ability to cause a current at a milliampere level to flow is required for the MOS transistor as the switching element in correspondence to a current when data is written. As is well known, a MOS transistor can cause a current a magnitude of which is proportional to a width (W) of a gate electrode, but is inversely proportional to a length (L) thereof to flow therethrough. Hence, if a size ratio of a length to a width of the gate electrode is determined, and moreover, certain design conditions are determined for the MOS transistor as the switching element, then absolute values of a length and a width of the gate electrode which are required will be inevitably determined therefrom. Usually, the ratio of W to L needs to be set to fall within the range of about 10 to 50 in order to cause a current of several milliamperes to flow. Thus, for example, if a MOS transistor device with L of 0.2 $\mu$m is intended to be formed, then W must be 2 to 10 $\mu$m.

SUMMARY OF THE INVENTION

In the light of the foregoing, it is, therefore, an object of the present invention to provide a magnetic memory (MRAM) having memory cells formed using tunnel magneto-resistance elements (TMR elements) which is capable of realizing a novel array structure, an operation thereof, and more miniature planar layout.

According to one aspect of the present invention, there is provided an MRAM including: a first wiring through which a write current is caused to flow in one direction; a selecting transistor provided on the downstream side of the write current in the first wiring; and a plurality of MRAM cells provided on an upstream side with respect to the position where the selecting transistor is provided in the first wiring. The other ends of the MRAM cells are connected to a second wiring through which a current is caused to flow in both directions. The first wiring is a first sub-wiring which is connected to a first main wiring directly, not through a transistor, and the second wiring is a second sub-wiring which is connected to a second main wiring through a transistor. The first and second main wirings are a main bit line and a main word line, respectively, and the first and second sub-wirings are a sub-bit line and a sub-word line, respectively.

More specifically, according to the present invention, MOS transistor switching transistors as switching elements of a memory cell array are arranged inversely with respect to a conventional arrangement (refer to FIG. 9), i.e., they are arranged at only end portions of a sub-memory cell array. Then, the main bit line and the sub-bit line, or the main word line and the sub-word line are directly connected to each other. The switching transistor is arranged so as to meet the arrangement order of the main bit line, the sub-bit line and the switching transistor connected in series with each other.

Since a current conducting state of the switching transistor can be controlled with a current caused to flow through this series-connected elements, the selection of the sub-memory cell array becomes possible. In addition, according to the present invention, in the operation of the switching transistor, unlike the above description of the prior art, a channel current depending on both a width and a length of a gate electrode is not utilized, but a current (substrate current) caused to flow from a drain diffusion layer to a semiconductor substrate is utilized. A so-called snap back current which is caused to flow by applying a voltage near a breakdown voltage to a drain may be utilized as the substrate current. In other words, the operation principles when turning ON the switching transistor utilizes junction breakdown of a drain electrode, or a current caused to flow in a direction from a drain electrode to a substrate, irrespective of presence or absence of channel formation owing to a gate electrode of a normal MOS transistor.

As described above, in the present invention, since the selecting transistor is provided on the downstream side of the wiring, a write current is prevented from being regulated by the channel current of the selecting transistor. More specifically, in the present invention, the channel current of the switching transistor is not used, but the substrate current is utilized. Therefore, a large current can be caused to flow with a small transistor area without depending on the ratio of a width W to a length L of a channel. As a result, according to the present invention, it is possible to reduce an area of a memory cell array.

Moreover, in the present invention, a normal D.C. current is not steadily caused to flow. Instead, the electric charges are accumulated in the electrostatic capacities of the main bit lines, and the electric charges thus accumulated therein are discharged all at once in the form of a discharge current by turning ON the switching transistor. Then, data may be written to a memory cell by utilizing the discharge current.

In the present invention, predetermined write currents are caused to flow through a word line and a bit line, respectively, to induce magnetic fields in the circumference of the word line and the bit line, whereby binary digit data 0 or 1 is stored in a memory cell located at a crossing point between the word line and the bit line on the basis of the induced magnetic fields.

The memory cell of the present invention is a storage element which is constituted by a magneto-resistance element having at least three layers including first and second magnetic thin films, and an insulating film sandwiched between the first and second magnetic thin films, and which serves to store therein binary digit data 0 or 1 in accordance with a change of the tunnel electrical resistance in the insulating film. At this time, this change of the tunnel electrical resistance in the insulating film depends on whether directions of magnetization of the first and second ferromagnetic thin films are parallel or anti-parallel to each other due to a change of the magnitude of an external magnetic field.

A word line selecting transistor and a bit line selecting transistor of the present invention are MOS transistors (of an n-type, for example), and their gate electrodes are connected to a word line selecting signal line and a bit line selecting signal line to be controlled in accordance with a word line selecting signal and a bit line selecting signal, respectively. The MRAM of the present invention may have a write circuit and a read circuit which are common to a plurality of sub-memory cell arrays. It is more desirable to have a unit for synchronizing timings at which the switching transistors are turned ON so that write currents are simultaneously caused to flow through the word line and the bit line. It is more desirable to adopt a structure with which a drain diffusion layer of the switching transistor has a relatively low breakdown voltage.

According to the present invention, there is provided a data writing method for an MRAM including TMR cells, in which data is written to corresponding one of the TMR cells using a snap back current.

According to the present invention, there is provided a data writing method for an MRAM including TMR cells, including the steps of accumulating electric charges in an electrostatic capacity of one of word lines and bit lines, and discharging the accumulated electric charges in the form of a discharge current to write data to one of the TMR cells using the discharge current.

BRIEF DESCRIPTION OF THE DRAWINGS

FIG. 8 is a schematic view useful in explaining a method of writing data to an MRAM cell.

DESCRIPTION OF THE PREFERRED EMBODIMENTS

Figure 1:
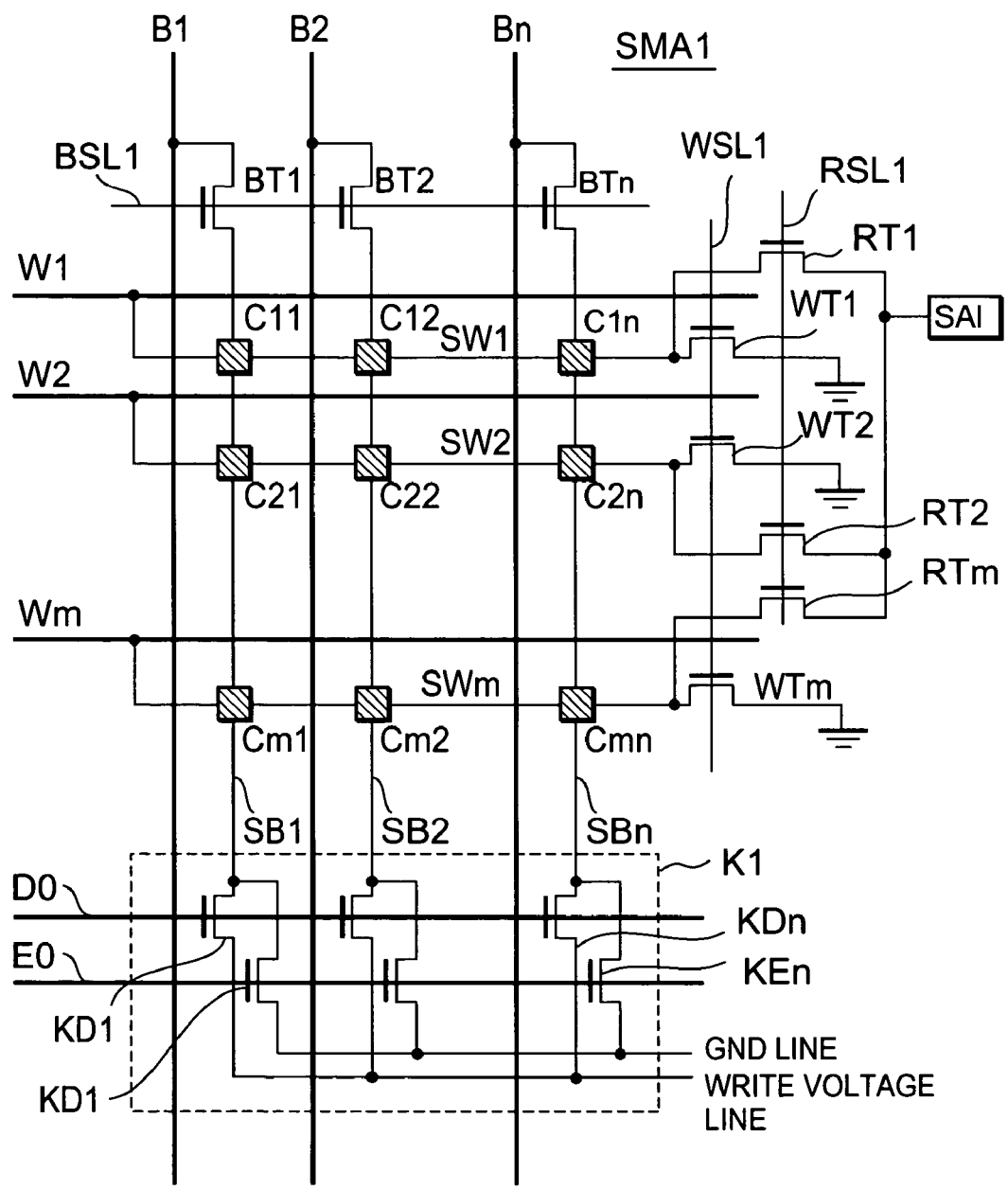
FIG. 1 is a circuit diagram showing an MRAM according to a first embodiment of the present invention.

FIG. 1 is a circuit diagram showing a sub-memory cell array SMA1 of an MRAM according to a first embodiment of the present invention.

The sub-memory cell array SMA1 includes a plurality of main word lines W1 to Wm (m: a natural number equal to or larger than 2), and a plurality of main bit lines B1 to Bn (n: a natural number equal to or larger than 2). The main word lines W1 to Wm are distributed so as to intersect the main bit lines B1 to Bn.

Sub-word lines SW1 to SWm are distributed in parallel with the main word lines W1 to WM, respectively. One ends of the sub-word lines SW1 to SWm are connected to the corresponding main word lines W1 to Wn, respectively, and the other ends thereof are connected to corresponding one ends (corresponding drain terminals) of word line selecting transistors WT1 to WTm for selecting one of word lines in sub-memory cell arrays, respectively. All gates of the word line selecting transistors WT1 to WTm are connected to a first word line selecting line WSL1. A word line selecting signal which is activated at the time when data is intended to be written to a memory cell is supplied to the word line selecting line WSL1. All the other ends of the word line selecting transistors WT1 to WTm are connected to a ground line. In addition, the other ends of the sub-word lines SW1 to SWm are connected to corresponding one ends of read transistors RT1 to RTm, respectively. All the other ends of the read transistors RT1 to RTm are connected to a sense amplifier SA1. A read signal line RSL1 to which a read signal is to be supplied is connected to each of gates of the read transistors RT1 to RTm.

Sub-bit lines SB1 to SBn are distributed in parallel with the main bit lines B1 to Bn, respectively. One ends of the sub-bit lines SB1 to SBn are connected to the corresponding main bit lines BT1 to BTn through bit line selecting transistors BT1 to BTn for selecting one of the bit lines in sub-memory cell arrays, respectively. All gates of the bit line selecting transistors BT1 to BTn are connected to a first bit line selecting line BSL1. A bit line selecting signal which is activated at the time when data is intended to be written and read out to and from a memory cell is supplied to the bit line selecting line BSL1. All the other ends of the sub-bit lines SB1 to SBn are connected to a write circuit K1. The write circuit K1 includes a first group of transistors KD1 to KDn and a second group of transistors KE1 to KEn. The first group of transistors KD1 to KDn are controlled in accordance with a first write control line D0 which is activated at the time when the write data goes to the level "1" for example and to which a first write data control signal is supplied. The second group of transistors KE1 to KEn are controlled in accordance with a second write control line E0 which is activated at the time when the write data goes to the level "0" for example and to which a second write data control signal is supplied.

The word line selecting transistors WT1 to WTn, and the bit line selecting transistors BT1 to BTn are constituted by MOS transistors respectively.

Next, an operation of the cell array of the present invention will hereinbelow be described with reference to FIG. 1. In this case, the description will now be given with respect to a case where data is written to a memory cell C11 of the first sub-memory cell array SMA1.

First of all, the word line W1 is selected and then a selection signal is inputted to the first word selecting line WSL1 to cause the word line selecting transistors WT1 to conduct. All the main word lines W2 to Wm other than the selected word line W1 are not selected. As a result, the sub-word line SW1 connected to the main word line W1 is selected. Next, a write current is caused to flow through the main word line W1 using a constant current source (not shown) for example. The write current flows from the main word line W1 to the word line selecting transistor WT1 through the sub-word line SW1. At the same time, the main bit line B1 is selected and then a selection signal is inputted to the first bit selecting line BSL1 to cause the bit line selecting transistor BT1 to conduct. All the main bit lines B2 to Bn other than the main bit line B1 are not selected. As a result, the sub-bit line SB1 connected to the main bit line B1 is selected. On the other hand, in the write circuit K1, the transistor KE1 is put into a conducting state and the transistor KD1 is put into a non-conducting state in accordance with a signal which is suitably introduced. If under this state, the write current supplied from the constant current source (not shown) is caused to flow through the main bit line B1, then the write current is caused to flow from the main bit line W1 to the sub-bit line SB1 through the bit line selecting transistor BT1. On the other hand, in a case where data different from the foregoing is written to the memory cell C11, the transistor KE1 is put into the non-conducting state, and the transistor KD1 is put into the conducting state. As a result, the write current is caused to flow from the sub-bit line SB1 to the main bit line B1 through the bit line selecting transistor BT1.

Figure 2:
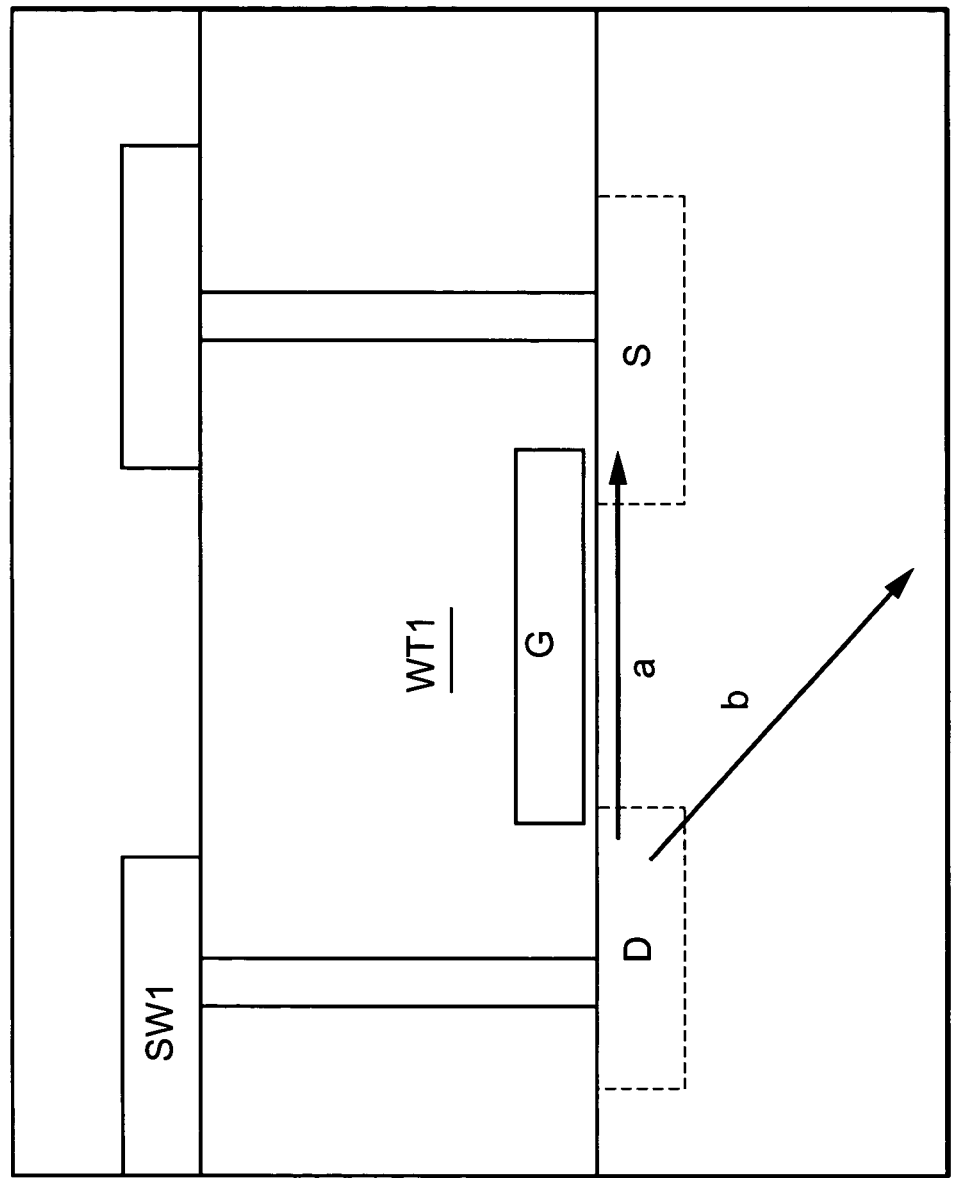
FIG. 2 is a diagram schematically showing the operation of a selecting transistor WT shown in FIG. 1.

At the time when data is intended to be written to a memory cell, a current of several milliamperes is caused to flow through the corresponding one of the word line selecting transistors WT1 to WTm. In this case, for this current, a channel current a of a normal MOS transistor is not utilized, but a current b caused to flow from a drain, i.e., a terminal connected to the corresponding one of the sub-word lines SW1 to SWm to the substrate is utilized (refer to FIG. 2).

Figure 3:
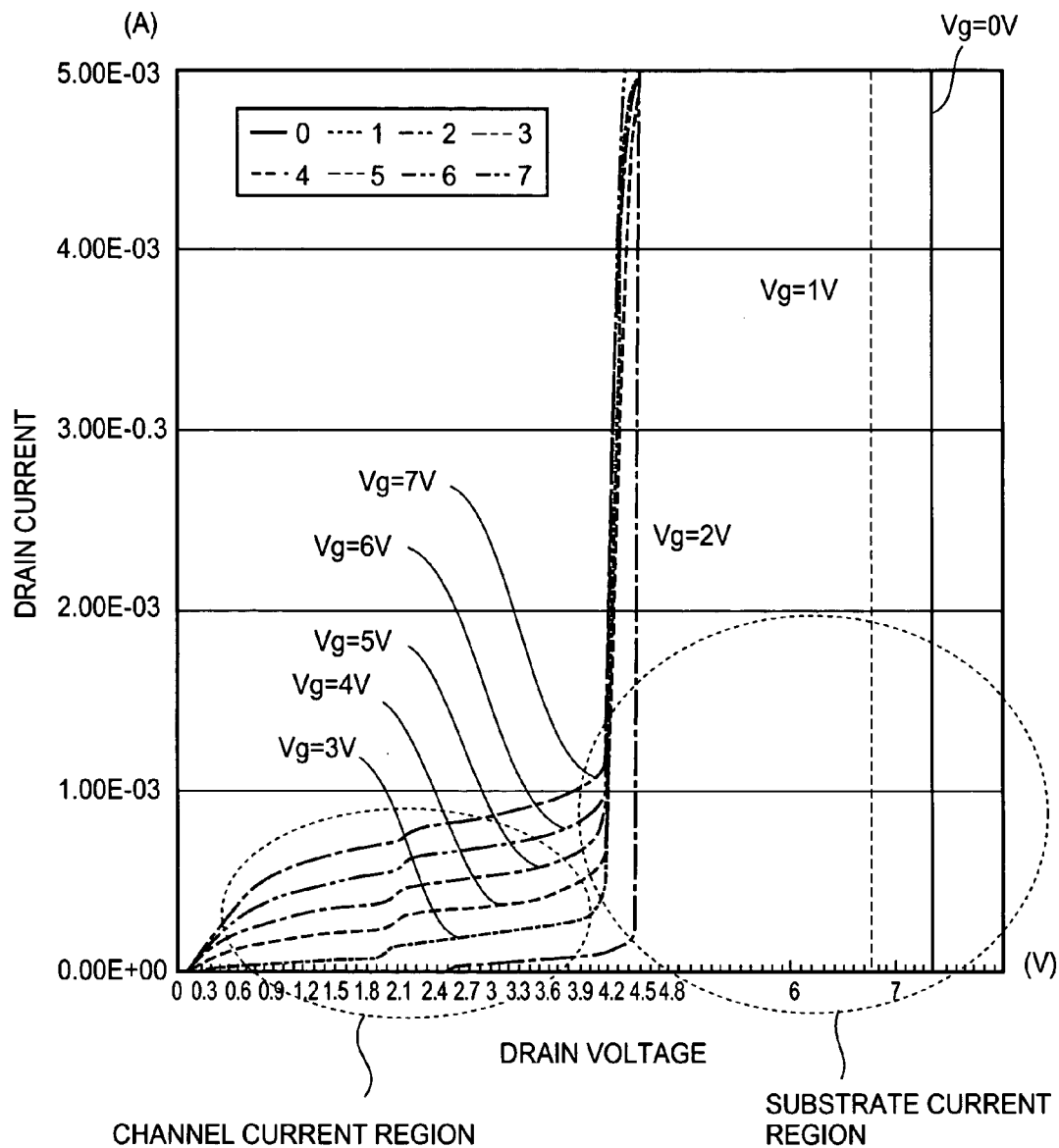
FIG. 3 is a graphical representation useful in explaining a write current of a device shown in FIG. 1.

The characteristics of such a substrate current is shown in FIG. 3.

FIG. 3 shows characteristic curves of a relationship between a drain voltage (V) (axis of abscissa) of a MOS transistor and a drain current (A) thereof (axis of ordinate), plotted for a gate voltage as a parameter ranging from 0 V to 7 V. From these characteristic curves, it is understood that while a drain voltage is kept low, a channel current of the MOS transistor is caused to flow, but as the drain voltage becomes large, a substrate current is caused to flow. It is found out that when the gate voltage becomes high, this phenomenon is easy to occur even if the drain voltage is relatively low. This phenomenon is called a so-called snap back phenomenon. The snap back phenomenon occurs due to the following process: By applying a high voltage to a drain, 1. impact ionization occurs in the vicinity of the drain,
2. the positive holes are caused to flow into a substrate,
3. a source and a substrate are biased in a forward direction,
4. a large number of electrons are caused to flow from the source into the substrate, and
5. impact ionization further occurs in the vicinity of the drain to cause the positive holes to flow into the substrate to provide a positive feedback state.

In short, in the snap back phenomenon, a parasitic bipolar transistor of a source (emitter), a substrate (base) and a drain (collector) is caused to conduct, breaking down the source to drain so that a drain voltage is reduced to show a negative resistance. In this phenomenon, the generated voltage is further reduced as a gate length becomes shorter. Moreover, if this phenomenon occurs, then a current is caused to flow towards the substrate. However, since this current is not a current caused to flow through a channel of a normal MOS transistor, even in a case of a small transistor, a large current can be caused to flow without being in proportion to the ratio of a channel width to a channel length. For this reason, when the present invention is applied to a transistor for selecting a word line or a bit line, even with a MOS transistor having layout of a relatively small area, a large current can be caused to flow.

For example, when data is intended to be written to the memory cell C11, in order that the snap back phenomenon may be caused to occur in the selecting transistor WT1, a voltage in the range of 4.2 to 7.0 V, e.g., a voltage of 4.2 V is applied to the main word line W1 in accordance with the characteristics shown in FIG. 3 to cause a write current to flow therethrough. Also, a predetermined voltage, e.g., a voltage of 4.2 V is applied to the main bit line B1 as well. The above-mentioned voltages are applied in the form of pulses to the word line selecting line WSL1 and the bit line selecting line BSL1 to cause currents to flow therethrough, respectively.

Other word lines and bit lines which are not selected are grounded or a voltage not allowing the snap back phenomenon to occur is applied thereto so that no write current is caused to flow therethrough. From FIG. 3, for example, a voltage which is larger than 0 V, but smaller than 4.2 V corresponds to the voltage not allowing the snap back phenomenon to occur. In general, since a withstanding voltage of the TMR element is about 1.5 V, when the voltage applied to the selected main word line and main bit line is 4.2 V, it is more preferable to apply a voltage in the range of 2.7 to 3.7 V to the word lines and the bit lines which are not selected. This voltage is "a voltage not allowing the snap back phenomenon to occur". Since if the current concerned does not reach a level required for the magnetic inversion, then no disturbance is caused in the TMR element, and therefore such a voltage can be set.

The description has been given so far with respect to the method of writing data to the memory cell C11 at a crossing point between the sub-word line SW1 and the sub-bit line SB1.

When the data is read out from a memory cell, e.g., the memory cell C11 of the first sub-memory cell array SMA1, only the main bit line B1 is selected to apply thereto a read voltage. The main bit lines other than the main bit line B1 are not selected.

A read current is caused to flow from the selected main bit line B1 through the sub-bit line SB1, the memory cell C11, the sub-word line SW1 and the word line read selecting transistor RT1. Then, the read current is supplied to the sense amplifier SA1 to be detected thereby.

Figure 4:
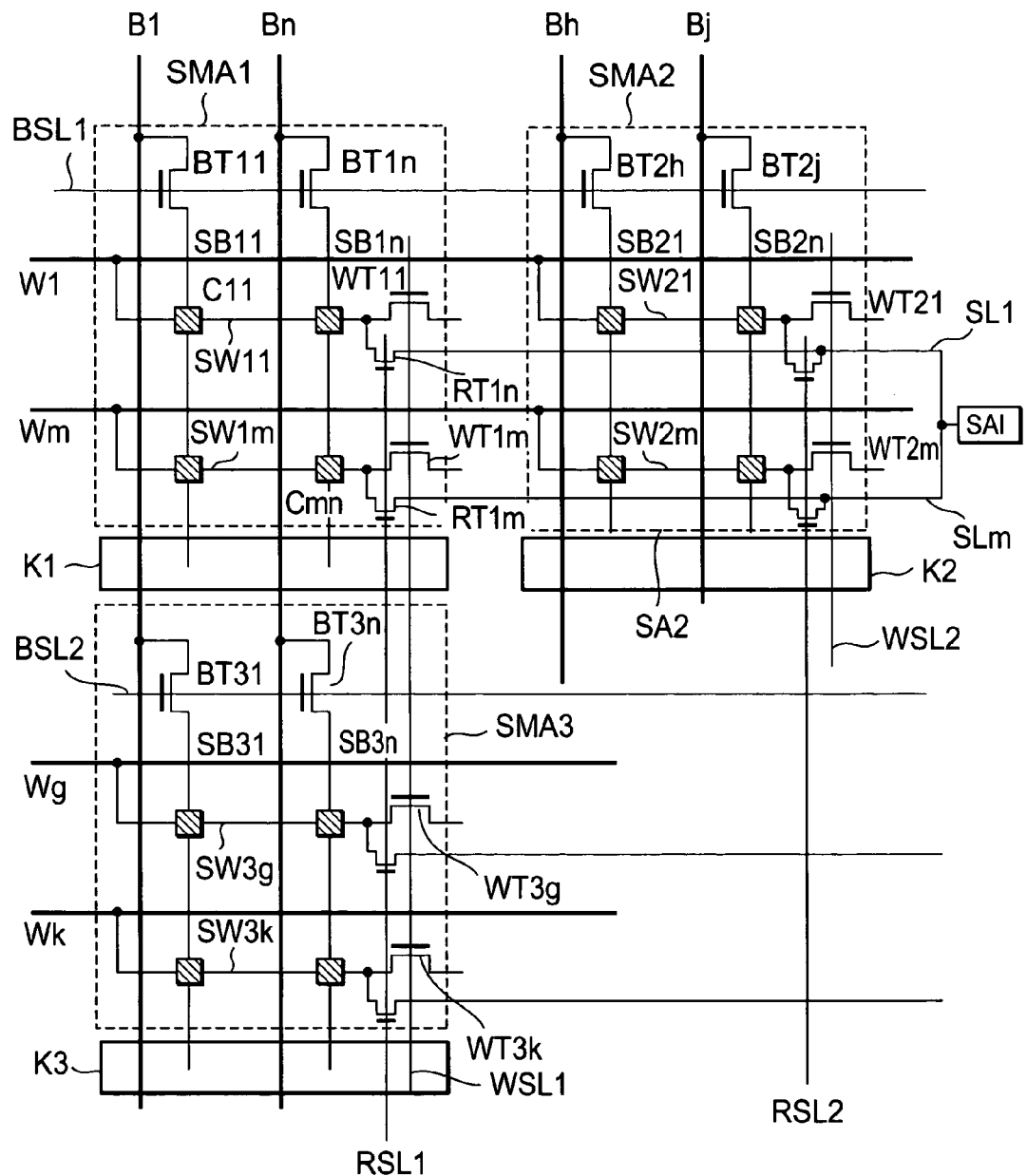
FIG. 4 is a circuit diagram showing an MRAM according to a second embodiment of the present invention.

FIG. 4 is a circuit diagram showing an MRAM according to a second embodiment of the present invention.

FIG. 4 shows a memory cell array of the MRAM of the present invention in which a plurality of sub-memory cell arrays each shown in FIG. 1 are arranged. While sub-memory cell arrays are arranged in a matrix, in this embodiment, only sub-memory cell arrays SMA1 to SMA3 are illustrated. The description of a respect of giving a detailed account of the sub-memory cell array SMA1 shown in FIG. 1 is omitted here for the sake of simplicity.

The sub-memory cell array SMA1 and the sub-memory cell array SMA2 hold the main word lines W1 to Wn in common. The sub-memory cell array SMA2 includes: main bit lines Bh to Bj (h, j: a natural number equal to or larger than 2, n<h, h<j); sub-bit lines SB21 to SB2n distributed in correspondence to the main bit lines Bh to Bj; sub-word lines SW21 to SW2m distributed in correspondence to the main word lines W1 to Wm; and memory cells arranged at crossing points between the sub-word lines SW21 to SW2m and the sub-bit lines SB21 to SB2n. That is to say, the sub-word lines SW11 and SW21 hold the main word line W1 in common. Thus, the memory cells C11 to C1n of the sub-memory cell array SMA1 and the memory cells C1h to C1j of the sub-memory cell array SMA2 hold the main word line W1 in common. Moreover, the sub-memory cell array SMA2 includes: selecting transistors BT2h to BT2j which are controlled so as to be caused to conduct through the bit line selecting line BSL1; selecting transistors WT21 to WT2m which are controlled so as to be caused to conduct through the word line selecting line WLS2 which is activated at the time when data is intended to be written to a memory cell; and a read line selecting line RSL2 which is activated at the time when data is intended to be read out from a memory cell. Furthermore, the sub-memory cell array SMA2, similarly to the sub-memory cell array SMA1, includes a write circuit K2.

The sub-memory cell array SMA1 and the sub-memory cell array SMA3 hold the main bit lines B1 to Bn in common. The sub-memory cell array SMA3 includes: main word lines Wg to Wk (g, k: a natural number equal to or larger than 2, m<g, g<k); sub-word lines SW3g to SW3k distributed in correspondence to the main word lines Wg to Wk; sub-bit lines SB31 to SB3n distributed in correspondence to the main bit lines B1 to Bn; and memory cells provided at crossing points between the sub-word lines SW3g to SW3k and the sub-bit lines SB31 to SB3n. Moreover, the sub-memory cell array SMA3 includes: selecting transistors BT31 to BT3n which are controlled so as to be caused to conduct through the bit line selecting line BSL2; selecting transistors WT3g to WT3k which are controlled so as to be caused to conduct through the word line selecting line WSL1 which is activated at the time when data is intended to be written to a memory cell; and a read selecting line RSL1 which is activated at the time when data is intended to be read out from a memory cell.

Description will hereinbelow be given with respect to the operation for writing data to the memory cell C11 of the sub-memory cell array SMA1.

The main word line W1 is selected, and a selection signal is inputted to the first word line selecting line WSL1 to cause a word line selecting transistor WT11 to conduct. Other main word lines W2 to Wm other than the main word line W1 are not selected. A non-selection signal is inputted to each of the word line selecting lines other than the first word line selecting line WSL1 to make the word line selecting transistors connected thereto get the non-conducting state. As a result, of the sub-word lines connected to the main word line W1, only the sub-word line SW11 is selected. Then, when a write current is caused to flow through the main word line W1, the write current is then caused to flow from the selected main word line W1 to the selected sub-word line SW11, and the selected word line selecting transistor WT11. On the other hand, concurrently therewith, the main bit line B1 is selected, and a selection signal is inputted to the first bit line selecting line BSL1 to cause the bit line selecting transistor BT11 to conduct. Other main bit lines other than the main bit line B1 are not selected. Moreover, a non-selection signal is inputted to each of the bit line selecting lines other than the first bit line selecting line BSL1 to make the bit line selecting transistors connected thereto get the non-conducting state. As a result, of the sub-bit lines connected to the main bit line B1, only the sub-bit line SB11 is selected. Then, when a write current is caused to flow through the main bit line B1, the write current is then caused to flow from the selected main bit line W1 to the selected sub-bit line SB11, and the selected bit line selecting transistor BT11.

As a result, the memory cell C11 at the crossing points between the sub-word line SW11 and the sub-bit line SB11 to write data to the memory cell C11.

For reading-out of data from a memory cell, when data stored in the memory cell C11 of the first sub-memory array SMA1, for example, is intended to be read out, only the main bit line B1, for example, is selected to apply thereto a read voltage. Other main bit lines other than the main bit line B1 are not selected. Also, the first word line selecting line WSL1 is selected, and other word line selecting lines other than the first word line selecting line WSL1 are not selected.

The read current is caused to flow from the selected main bit line B1 to the memory cell C11 and the sub-word line SW11 through the sub-bit line SB11. The read current is then supplied to the sense amplifier SA1 through a read transistor RT11 and a sense line SL1.

At the time when data is intended to be written to a memory cell, a current of several milliamperes is caused to flow through the corresponding one of the word line selecting transistors WT11 to WT1m, WT21 to WT2m and WT3g to WT3k. Then, for this current, a channel current of a normal MOS transistor is not utilized, but a current which is caused to flow from a drain, i.e., a terminal connected to the corresponding one of the sub-word lines SW11 to SW1m, SW21 to SW2m, and SW3g to SW3k to the substrate is utilized.

Figure 5:
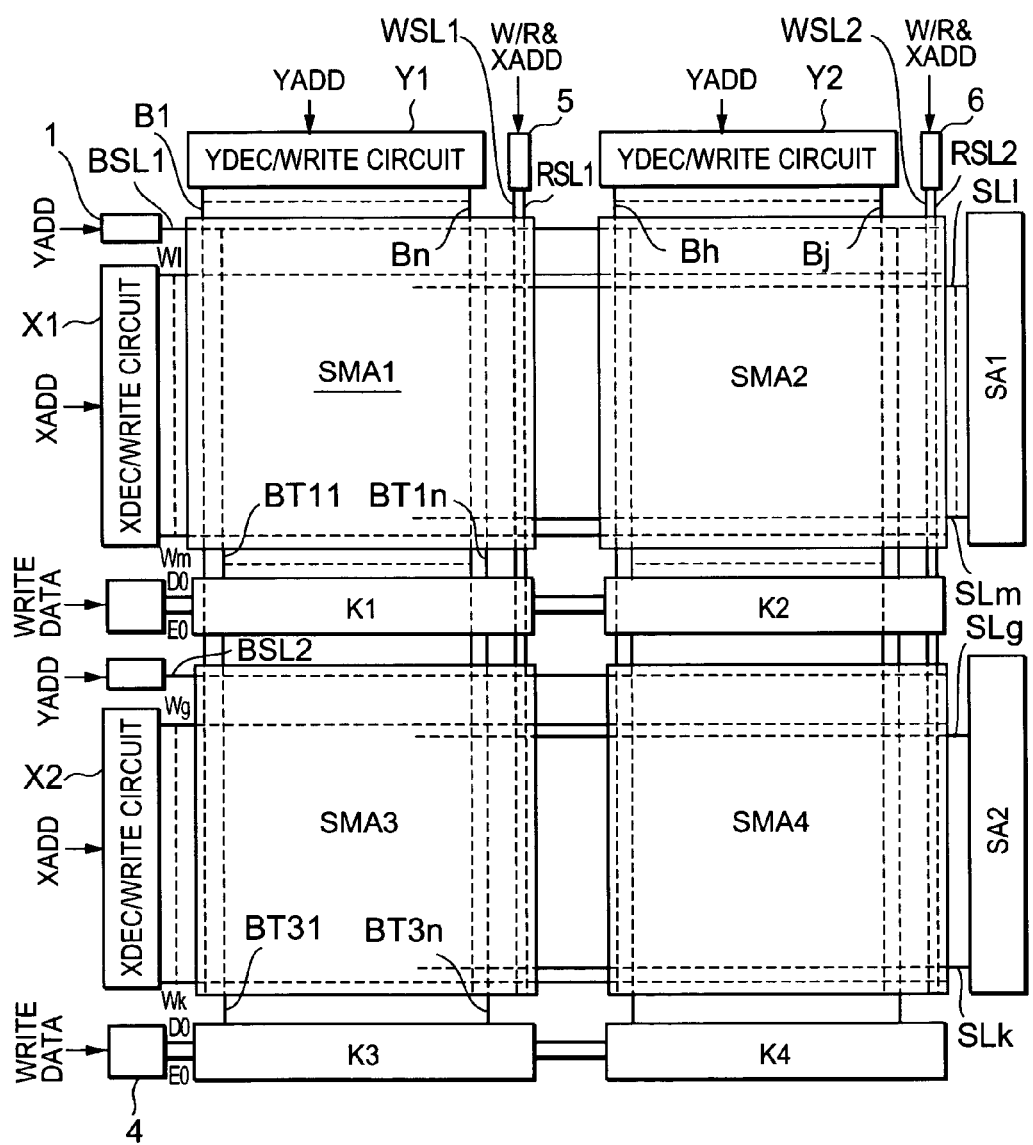
FIG. 5 is a circuit diagram showing an MRAM according to a third embodiment of the present invention.

FIG. 5 is a schematic block diagram of an MRAM according to a third embodiment of the present invention in which a plurality of sub-memory cell arrays each shown in FIG. 4 are arranged.

In the figure, sub-memory cell arrays SMA1 to SMA4 are arranged in a matrix.

An X decoder/write circuit X1 is arranged in the left end of the sub-memory cell array SMA1. The X decoder/write circuit X1 serves to drive the main word lines W1 to Wm connected in common to the sub-memory cell arrays SMA1 and SMA2 on the basis of an X address XADD. An X decoder/write circuit X2 is arranged in the left end of the sub-memory cell array SMA3. The X decoder/write circuit X2 serves to drive the main word lines Wg to Wk connected in common to the sub-memory cell arrays SMA3 and SMA4 on the basis of an X address XADD.

A Y decoder/write circuit Y1 is arranged in the upper end of the sub-memory cell array SMA1. The Y decoder/write circuit Y1 serves to drive the main bit lines B1 to Bn connected in common to the sub-memory cell arrays SMA1 and SMA3 on the basis of a Y address YADD. A Y decoder/write circuit Y2 is arranged in the upper end of the sub-memory cell array SMA2. The Y decoder/write circuit Y2 serves to drive the main bit lines Bh to Bj connected in common to the sub-memory cell arrays SMA2 and SMA4 on the basis of a Y address XADD.

A sense amplifier SMA1 is arranged in the right end of the sub-memory cell array SMA2. A signal read out from a memory cell of the sub-memory cell array SMA1 or the sub-memory cell array SMA2 is transferred to the sense amplifier SMA1 to be amplified thereby.

A sense amplifier SMA2 is arranged in the right end of the sub-memory cell array SMA4. A signal read out from a memory cell of the sub-memory cell array SMA3 or the sub-memory cell array SMA4 is transferred to the sense amplifier SMA2 to be amplified thereby.

The write circuit K1 for the sub-memory cell array SMA1 is arranged between the sub-memory cell arrays SMA1 and SMA3. Output terminals of the write circuit K1 are connected to the sub-bit lines SB1 to SBn, respectively. The write circuit K1 serves to connect each of the sub-bit lines to one of a power supply line or a grounding line on the basis of output signals D0 and E0 of write control circuits 3 and 4 for receiving write data information.

Write circuits K2 to K4 are arranged in the lower end of the sub-memory cell array SMA2, the lower end of the sub-memory cell array SMA3 and the lower end of the memory cell array SMA4, respectively. Similarly to the write circuit K1, each of these write circuits K2 to K4 serves to connect each of the sub-bit lines within the corresponding sub-memory cell array to one of the power supply line or the grounding line on the basis of the write data information.

A first BSL driver 1 is arranged in the position corresponding to both the left end of the sub-memory cell array SMA1 and the upper end of the X decoder/write circuit X1. The bit selecting line BSL1 for the sub-memory cell arrays SMA1 and SMA2 is derived from the sub-memory cell arrays SMA1 and SMA2 to the first BSL driver 1. At the time when the bit line selecting line BSL1 is activated, the first BSL driver 1 electrically connects the main bit line and the corresponding sub-bit line of the sub-memory cell array SMA1 or SMA2 to each other in response to Y address information.

A second BSL driver 2 is arranged in the position corresponding to both the left end of the sub-memory cell array SMA3 and the upper end of the X decoder/write circuit X2. The bit line selecting line BSL2 for the sub-memory cell arrays SMA3 and SMA4 is derived from the sub-memory cell arrays SMA3 and SMA4 to the second BSL driver 2. At the time when the bit line selecting line BSL2 is activated, the second BSL driver 2 electrically connects the main bit line and the corresponding sub-bit line of the sub-memory cell array SMA3 or SMA4 to each other in response to Y address information.

A first WSL/RSL driver 5 is a circuit for outputting a signal WSL1 in accordance with which at the time when data is intended to be written to a memory cell, corresponding one of the sub-word lines of the sub-memory cell arrays SMA1 and SMA3 is selected, and for outputting a signal RSL1 in accordance with which at the time when data is intended to be read out from a memory cell, corresponding one of the sub-word lines of the sub-memory cell arrays SMA1 and SMA3 is selected. A second WSL/RSL driver 6 is a circuit for outputting a signal WSL2 in accordance with which at the time when data is intended to be written to a memory cell, corresponding one of the sub-word lines of the sub-memory cell arrays SMA2 and SMA4 is selected, and for outputting a signal RSL2 in accordance with which at the time when data is intended to be read out from a memory cell, corresponding one of the sub-word lines of the sub-memory cell arrays SMA2 and SMA4 is selected. These WSL/RSL drivers 5 and 6 are driven on the basis of XADD and write/read information.

At the time when data is intended to be written to the memory cell C11 of the sub-memory cell array SMA1, the X decoder/write circuit X1, in response to XADD, selects the main word lines W1, and the Y decoder/write circuit Y1, in response to YADD, selects the main bit line B1. The first BSL driver 1 and the first WSL/RSL driver 5, in response to corresponding address signals, activate the bit line selecting signal BSL1 and the word line selecting signal WSL1, respectively. At this time, the word line read selecting signals RSL1 and RSL2 are not activated. As a result, the sub-memory cell array SMA1 having the memory cell C11 belonging thereto is selected.

In this embodiment, the configuration of the present invention is applied to the word lines, while the conventional configuration is applied to the bit lines. However, conversely, it may also be available that the configuration of the present invention is applied to the bit lines, while the conventional configuration is applied to the word lines.

Since no channel current is used for each of the current paths of the word line selecting transistors and the bit line selecting transistors, but the substrate current is utilized, a large current can be caused to flow with a small transistor area irrespective of the ratio of a channel width W to a channel length L. As a result, it is possible to reduce an area of a memory cell array.

Figure 6:
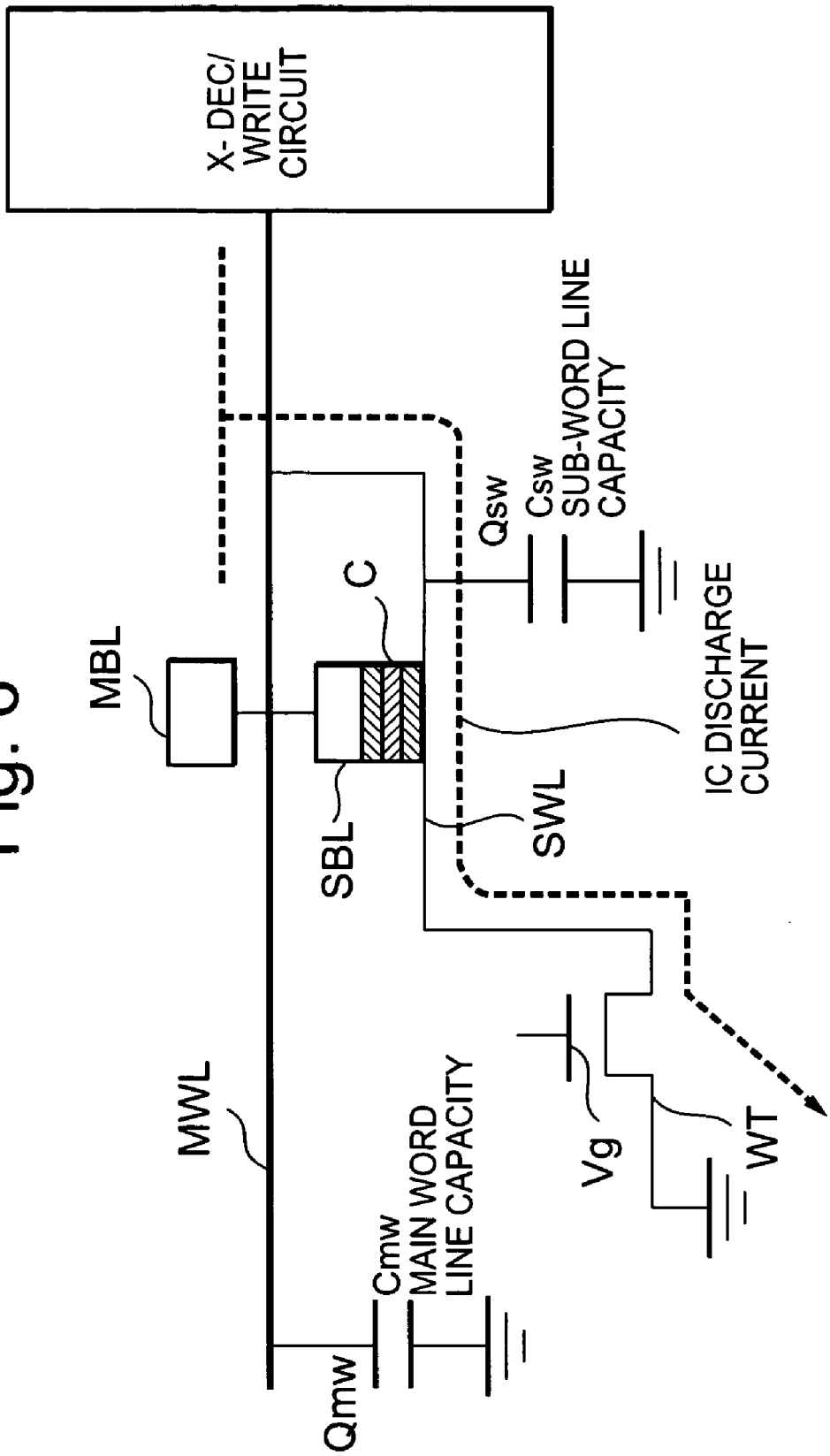
FIG. 6 is a circuit diagram showing an MRAM according to a fourth embodiment of the present invention.
Figure 7A:
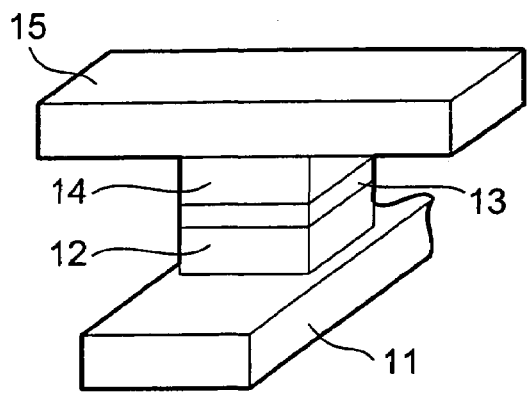
FIGS. 7A and 7B are perspective views useful in explaining a structure of an MRAM cell and a storage operation thereof.
Figure 7B:
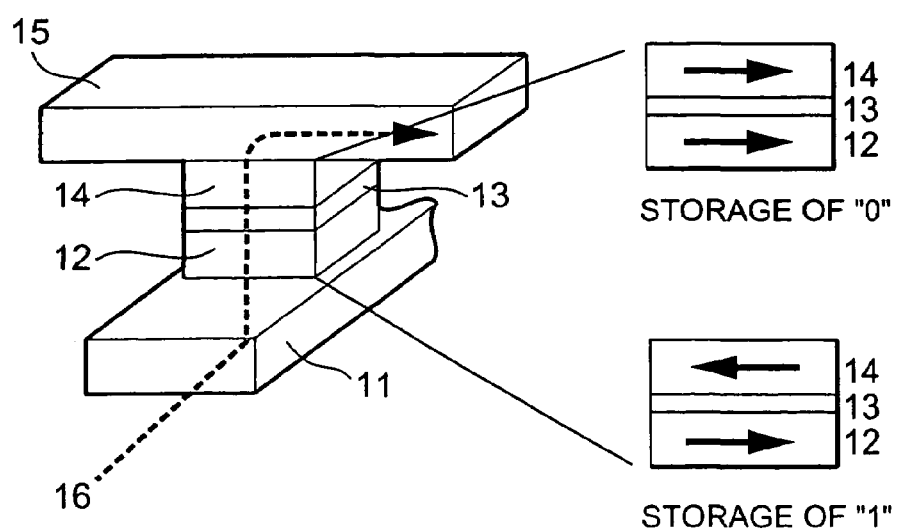
Figure 9:
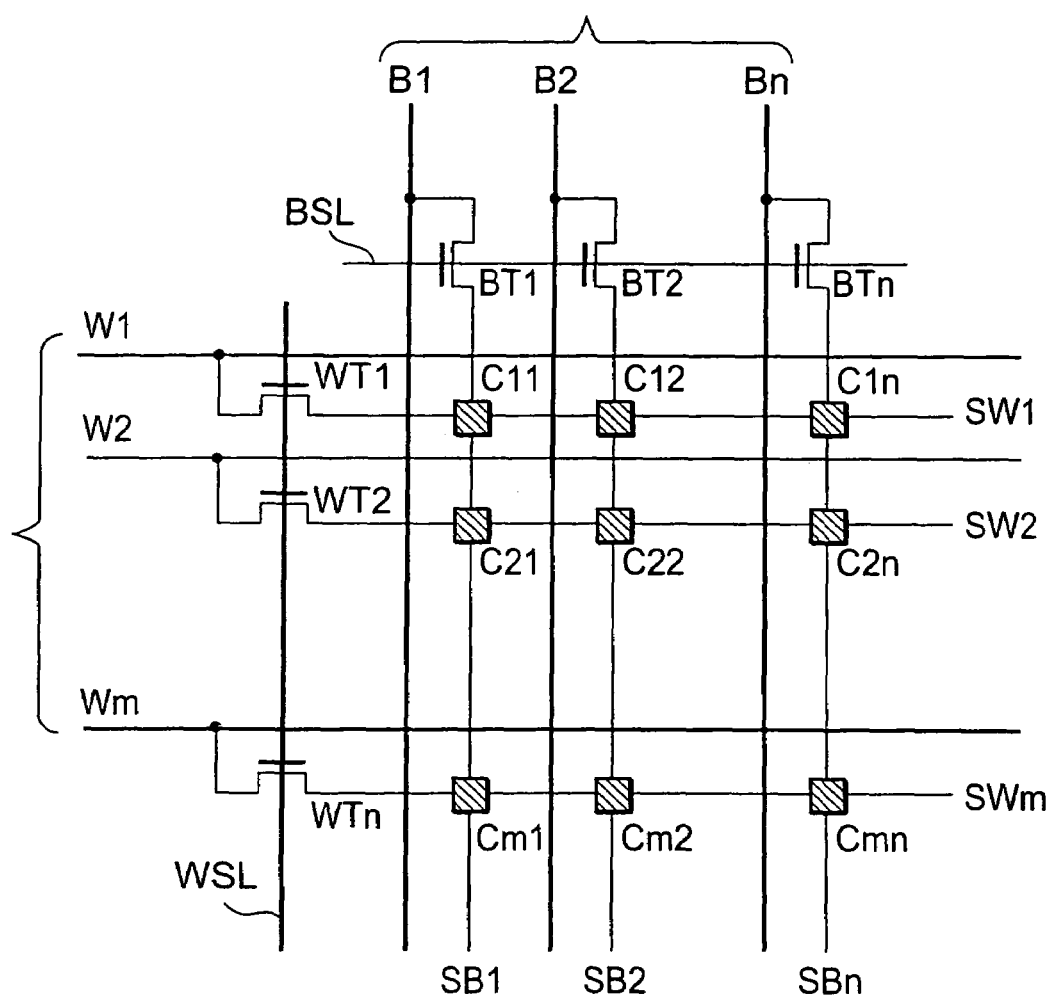
FIG. 9 is a circuit diagram showing a conventional MRAM cell array.

FIG. 6 is a schematic view showing an MRAM according to a fourth embodiment of the present invention.

The MRAM of this embodiment includes: a main word line MWL connected to an X decoder/write circuit; a sub-word line SWL connected to the main word line MWL; a word line selecting transistor WT connected to the sub-word line SWL; a main bit line MBL, a sub-bit line SBL connected to the main bit line MBL; and a TMR memory cell provided between the sub-bit line SBL and the sub-word line SWL. That is to say, this configuration is not substantially different from that of the MRAM shown in FIG. 1 in the least.

In this embodiment, data is written to a memory cell C by utilizing electrostatic capacities Cmw and Csw which the main word line MWL (corresponding to each of the main word lines W1 to Wm and Wg to Wk shown in FIG. 4) and the sub-word line SWL (corresponding to each of the sub-word lines SW11 to SW1m, SW21 to SW2m, and SW3g to SW3k shown in FIG. 4) have, respectively. First of all, the X decoder/write circuit previously applies a predetermined voltage to the main word line MWL and the sub-word line SWL to accumulate electric charges (positive electric charges and negative electric charges) in their electrostatic capacities Cmw and Csw, respectively. Then, these accumulated electric charges are assigned Qmw and Qsw, respectively. Likewise, the X decoder/write circuit previously applies a predetermined voltage to the main bit line MBL (corresponding to each of the main bit lines B1 to Bn and Bh to Bj shown in FIG. 4) and the sub-bit lines SBL (corresponding to each of the sub-bit lines SB11 to SB1n, SB21 to SB2n, and SB31 to SB3n shown in FIG. 4) by utilizing electrostatic capacities which the main bit line MBL and the sub-bit line SBL have, respectively, to accumulate electric charges in their electrostatic capacities, respectively.

Next, a predetermined input signal is applied to a signal input gate electrode Vg of the selecting transistor WT connected to the sub-word line SWL connected to a memory cell to be selected so that the selecting transistor WT enters a snap back state. At the same time, a predetermined voltage is applied to a selecting transistor (not shown) connected to the sub-bit line SBL connected to the memory cell C to be selected at a predetermined timing. As a result, the electric charges accumulated in the main word line MBL, the sub-word line SWL, the main bit line MBL, and the sub-bit line SBL, respectively, are discharged all at once in the form of discharge currents (only a discharge current Ic of the sub-word line SWL is illustrated in FIG. 6) through the selecting transistors. Then, magnetic fields induced by these discharge currents are generated to realize the magnetic field inversion of the memory cell C to thereby write data to the memory cell C.

It is preferable that in order that memory cells at crossing points between one selected line and the unselected lines may be prevented from being broken down while data is written to the memory cell C through the above-mentioned two selecting lines, the structure of the selecting transistor WT is optimized so that the snap back is caused with a drain voltage of about 1 V for example. By adopting this method, a withstanding voltage of a TMR element depending on a thickness of a tunnel film can be maintained nearly at the present withstanding voltage (about 1.5 V).

More specifically, a snap back drain withstanding voltage of the selecting transistor WT shown in FIG. 6 is set to about 1 V. The main word line MWL/the sub-word line SWL, and the main bit line MBL/the sub-bit line SBL of the memory cell C to which data is intended to be written are previously precharged with electricity corresponding to about 1 V. Other main word lines/other sub-word lines, and other main bit lines/other sub-bit lines are grounded, or a voltage of about 0.5 V is applied thereto.

A voltage required to cause the snap back phenomenon to occur is applied to the word selecting line and a predetermined voltage is applied to the bit selecting line in accordance with a signal representing start of the write operation. Thus, the selecting transistor WT is put into the snap back state to cause the selecting transistor BT to conduct to thereby discharge the electric charges accumulated through the precharging process at once in the form of a discharge current. Thus, data is written to the memory cell C with this discharge current.

According to this embodiment, since data is written to a memory cell with a discharge current in the form of which the temporarily charged electric charges are instantaneously discharged, there is no need to use a constant current source. Thus, there is offered the effect that when causing a steady write current, e.g., a write current as in the first embodiment to flow, the write current can be reduced as compared with a method of writing data by utilizing a write current supplied from a constant current source.

While in this embodiment, the description has been given with respect to a case where a write current is caused to flow from the corresponding one of the main word lines to the corresponding one of the sub-word lines, a write current may also be caused to flow from the corresponding one of the main bit lines to the corresponding one of the sub-bit lines.

It should be noted that the present invention is not intended to be limited to the above-mentioned embodiments and hence the various changes and modifications thereof may be made by those skilled in the art without changing the subject matter of the invention.

As set forth hereinabove, according to the present invention, it is possible to reduce an area.

What is claimed is:

1. A Magnetic random access memory (MRAM), comprising:
a first wiring through which a write current is caused to flow in one direction;
a selecting transistor having a first electrode connected to the first wiring and a second electrode connected to a power voltage potential supply node for controlling the write current; and
a plurality of magnetic memory cells each arranged on the first wiring, one end of the plurality of magnetic memory cells being connected to the first wiring.

2. The memory as claimed in 1, wherein the other end of the plurality of MRAM cells are connected to a second wiring through which a current is caused to flow in both directions.

3. The memory as claimed in claim 2, wherein the first wiring is a first sub-wiring, and the first sub-wiring is connected to a first main wiring directly, not through a transistor, and the second wiring is a second sub-wiring, and the second sub-wiring is connected to a second main wiring through a transistor.

4. A MRAM, comprising:
a main bit line;
a sub-bit line having one end connected to said main bit line;
a main word line;
a sub-word line having one end connected to said main word line;
a MRAM cell provided between said sub-word line and said sub-bit line; and
a select transistor coupled to the other end of one of said sub-word and said sub-bit lines.

5. The MRAM as claimed in claim 4, wherein a substrate current of said select transistor becomes a write current which flows through one of the sub-bit line and the sub-word line.

6. The MRAM as claimed in claim 5, wherein the substrate current is based on a snap back phenomenon which is caused to occur by applying a breakdown voltage to a drain of said select transistor.

7. The MRAM as claimed in claim 5, wherein the write current is a current generated when the electric charge accumulated in electrostatic capacity is discharged, which accompanies one of said main bit and sub-bit lines and said main word and sub-word lines.

8. A MRAM, comprising:
a plurality of first sub-row lines extending in a first direction;
a plurality of first sub-column lines extending in a second direction different from the first direction;
a first memory cell array including a plurality of first magnetic memory cells each arranged at crossing points between a corresponding one of said first sub-row lines and a corresponding one of said first sub-column lines;
a plurality of second sub-row lines extending in the first direction;
a plurality of second sub-column lines extending in the second direction;
a second memory cell array including a plurality of second magnetic memory cells each arranged at crossing points between a corresponding one of said second sub-row lines and a corresponding one of said second sub-column lines;
a plurality of third sub-row lines extending in the first direction;
a plurality of third sub-column lines extending in the second direction;
a third memory cell array including a plurality of third magnetic memory cells each arranged at crossing points between a corresponding one of said third sub-row lines and a corresponding one of said third sub-column lines;
a plurality of main row lines provided in common to said first and second memory cell arrays; and
a plurality of main column lines provided in common to said first and third memory cell arrays,
wherein each of the plurality of first sub-row lines of the first memory cell array has two end portions, and one of the two end portions is connected to one of the main row lines, and the other end portion of the two end portions is connected to a first row selecting transistor, and
each of the plurality of sub-column lines of the first memory cell array has two end portions, and one of the two end portions is connected to one of the main column lines through a column selecting transistor, and the other end portion of the two end portions is connected to a write circuit.

9. The MRAM as claimed in claim 8, wherein a predetermined write current caused to flow through one of the sub-row lines during a write operation is a current generated when a predetermined signal is supplied to a row selecting signal line of the row selecting transistors to make one of the row selecting transistors get a conducting state to discharge the electric charge previously accumulated in electrostatic capacity of one of the main row lines and the sub-row lines.

10. The MRAM as claimed in claim 9, wherein the conducting state of the row selecting transistor is a state in which a current is caused to flow from a drain of the row selecting transistor to a substrate.

* * * * *